United States Patent [19]

Wada et al.

[11] Patent Number: 4,970,409

[45] Date of Patent: Nov. 13, 1990

[54] VOLTAGE MULTIPLIER FOR NONVOLATILE SEMICONDUCTOR MEMORY

[75] Inventors: Yukio Wada; Tadashi Maruyama, both of Yokohama, Japan

[73] Assignee: Kabushiki Kaisha Toshiba, Kawasaki, Japan

[21] Appl. No.: 332,325

[22] Filed: Apr. 3, 1989

[30] Foreign Application Priority Data

Apr. 7, 1988 [JP] Japan ................................. 63-85951

[51] Int. Cl.[5] ........................ H03K 3/01; H02M 3/18; G11C 00/00; H03L 5/00
[52] U.S. Cl. .................... 307/296.1; 307/264; 307/296.5; 307/110; 307/296.3; 363/60; 365/226
[58] Field of Search ..................... 307/264, 578, 296.1, 307/296.3, 296.5, 110; 365/228, 226; 363/60; 320/1

[56] References Cited

U.S. PATENT DOCUMENTS

| 4,000,412 | 12/1976 | Rosenthal et al. | 307/296.1 |
| 4,405,868 | 9/1983 | Lockwood | 307/296.1 |
| 4,839,787 | 6/1989 | Kojima et al. | 307/110 |

OTHER PUBLICATIONS

Dickson, "On-Chip High-Voltage Generation in MNOS Integrated Circuits Using an Improved Voltage Multiplier Technique", IEEE Journal of Solid-State Circuits, vol. SC-11, No.3, Jun. 1976, pp. 374-378.
Carr et al, "MOS/LSI Design and Application" McGraw Hill, 1972 pp. 123-124.

Primary Examiner—Stanley D. Miller
Assistant Examiner—Trong Phan
Attorney, Agent, or Firm—Finnegan, Henderson, Farabow, Garrett and Dunner

[57] ABSTRACT

A voltage multiplier for a use in a non-volatile semiconductor memory and operated at a low operation voltage with a reduced area comprising a plurality of cascade-connected basic circuits.

6 Claims, 8 Drawing Sheets

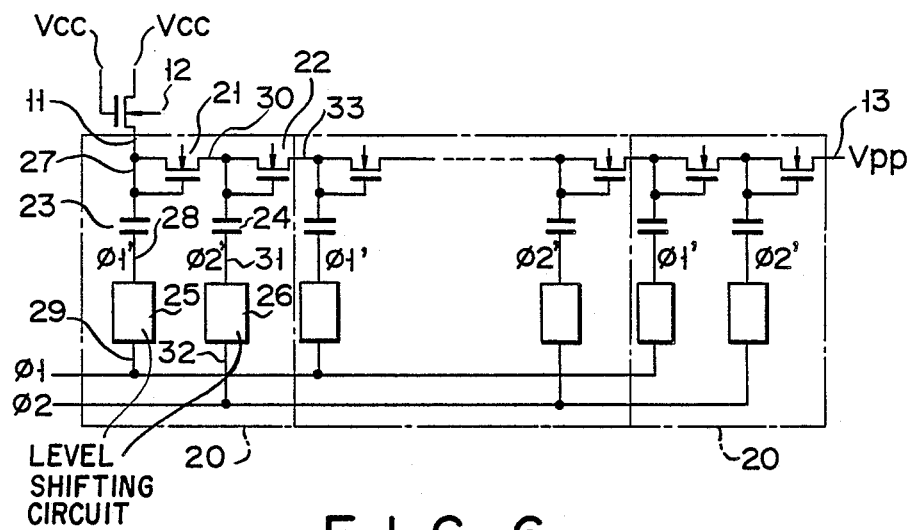
F I G. 6
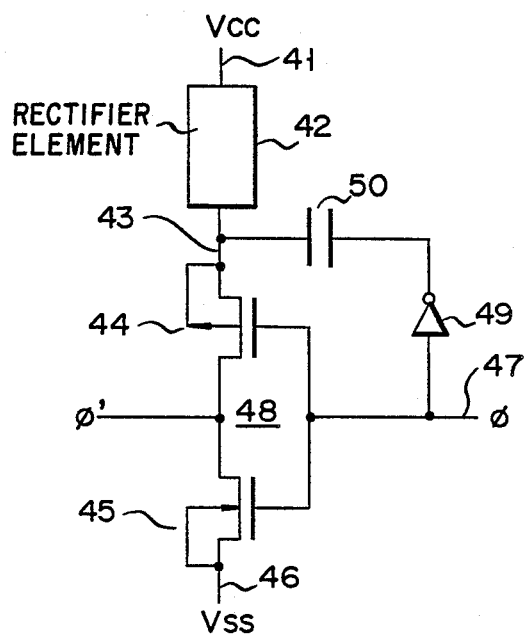
F I G. 7

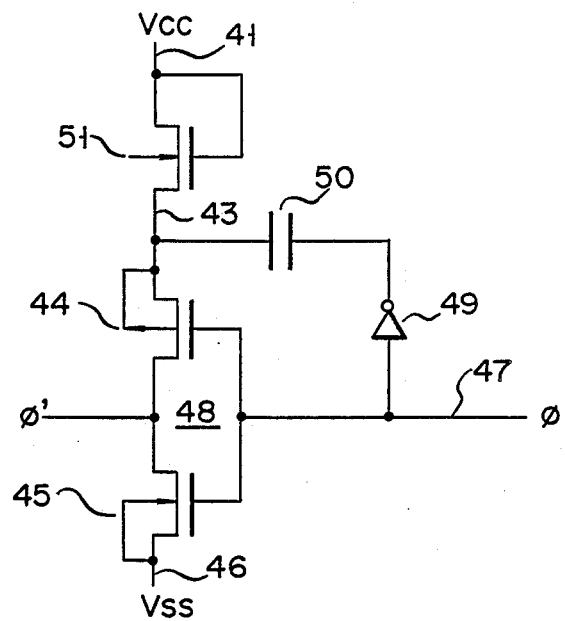
F I G. 10
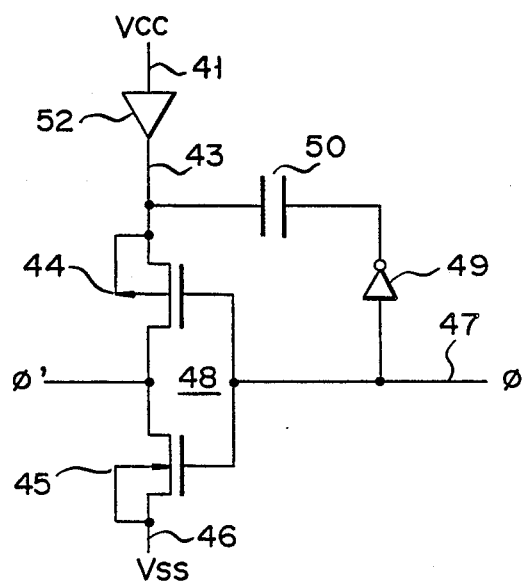
F I G. 13

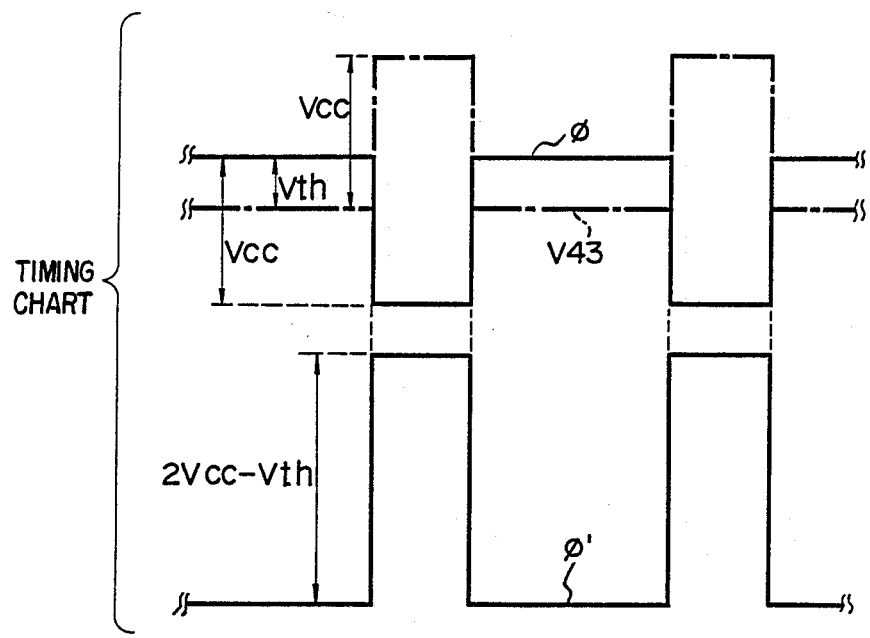
F I G. 11
| ø | 5V | 0V | 5V | 0V |
| --- | --- | --- | --- | --- |
| V43 | 4V | 9V | 4V | 9V |
| ø' | 0V | 9V | 0V | 9V |
F I G. 12

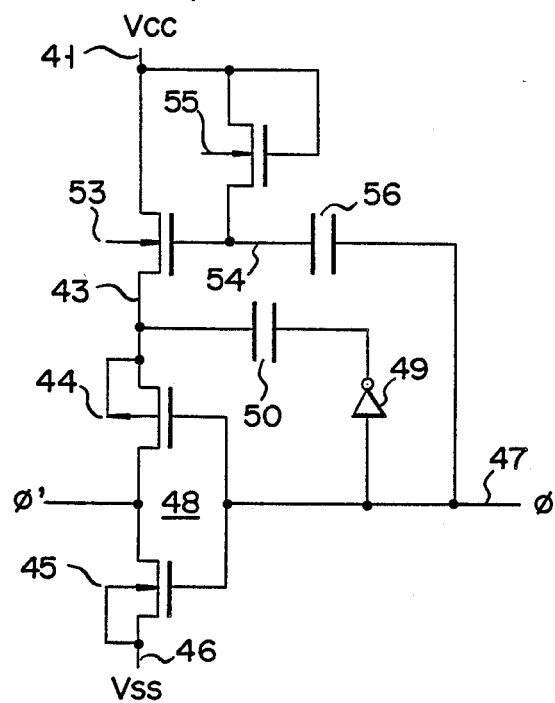
F I G. 14

| ∅ | 0V | 5V | 0V | 5V |
|---|---|---|---|---|
| V54 | 4V | 9V | 4V | 9V |
| V43 | — | 5V | 10V | 5V |
| ∅' | — | 0V | 10V | 0V |

VOLTAGE MULTIPLIER FOR NONVOLATILE SEMICONDUCTOR MEMORY

BACKGROUND OF THE INVENTION

1. Field of the Invention

This invention relates to a voltage multiplier for stepping up a voltage, and more particularly to a voltage multiplier for use in a nonvolatile semiconductor memory.

2. Description of the related art

Recently, nonvolatile semiconductor memories which each have a floating gate and in which data can be electrically erased and programmed have been widely applied instead of the conventional ultraviolet erasable nonvolatile semiconductor memories. In such electrically erasable and programmable nonvolatile semiconductor memories, the data programming or erasing operation may be effected by injecting electrons into the floating gate via a thin oxide film of 100 Å to 200 Å, for example, or emitting the electrons from the floating gate utilizing the Fouler-Nordheim tunneling effect. In the data programming or erasing operation, a high voltage of +10 to +20 V which is sufficiently higher than the normal power source voltage of +5 V is used. The current capacity of the high voltage can be set to be extremely small. Therefore, the high voltage is generally supplied from a voltage multiplier formed in the integrated circuit in which the memory is arranged so as to step up the power source voltage of +5 V. Formation of the voltage multiplier in the integrated circuit makes it possible to use only one power source voltage to be externally supplied to the integrated circuit, thus giving a great advantage to the user.

The prior art voltage multiplier is disclosed in the article by J. F. Dickson, "On-chip High-Voltage Generation in NMOS Integrated Circuits Using an Improved Voltage Multiplier Technique", IEEE JOURNAL OF SOLID STATE CIRCUITS, VOL. SC-11, NO. 3, pp. 374 to 378, June 1986, for example.

FIG. 1 is circuit diagram showing the construction of the voltage multiplier which is modified so as to be suitably formed in the MOS integrated circuit. The source-drain paths of N-channel MOS transistors 71 are connected in series between power source voltage terminal Vcc and a node from which stepped-up voltage Vpp is derived. The gates of transistors 71 are connected to the respective sources thereof. Capacitors 72 are connected at one end to the respective gates of transistors 71. The other ends of those of capacitors 72 which lie in the odd stages are supplied with clock signal $\phi 1$ and the other ends of those capacitors which lie in the even stages are supplied with clock signal $\phi 2$. As shown by the timing chart of FIG. 2, clock signals $\phi 1$ and $\phi 2$ are generated such that the high level components will not occur in the same period.

In the voltage multiplier of the above construction, power source voltage Vcc of +5 V is sequentially stepped up in response to clock signals $\phi 1$ and $\phi 2$ to supply high voltage Vpp of +20 V, for example.

FIG. 3 is a circuit diagram showing the construction of a basic circuit of the conventional voltage multiplier. The basic circuit includes a first stage circuit formed of transistor 71A and capacitor 72A and a second stage circuit formed of transistor 71B and capacitor 72B. The conventional circuit of FIG. 1 can be obtained by connecting the basic circuits in cascade fashion. Approx. 10 basic circuits are necessary to constitute a circuit for deriving out high voltage Vpp of +20 V from power source voltage Vcc of +5 V.

Now, the operation of the basic circuit of FIG. 3 is explained with reference to the timing chart shown in FIG. 4. When clock signals $\phi 1$ and $\phi 2$ are both at "L" level, transistors 71A and 71B are both turned off. Therefore, the potentials of nodes 73 and 74 to which the drains of transistors 71A and 71B are connected are kept at previous potential levels V73 and V74.

When clock signals $\phi 1$ and $\phi 2$ are set at "H" and "L" levels, respectively, the potential of node 73 is stepped up by amplitude $V\phi$ of clock signal $\phi 1$ and set to $(V73+V\phi)$ by means of capacitor 72A. At this time, transistor 71A is turned on and node 74 is charged to $(V73+V\phi-Vth)$ via transistor 71A. In this case, Vth denotes the threshold voltage of transistor 71.

Next, when clock signals $\phi 1$ and $\phi 2$ are both set at "L" level again, transistors 71A and 71B are both turned off, and the potentials of nodes 73 and 74 are kept at the previous potential levels.

After this, when clock signals $\phi 1$ and $\phi 2$ are set at "L" and "H" levels, respectively, the potential of node 74 is stepped up by amplitude $V\phi$ of clock signal $\phi 2$ and set to $(V74+V\phi)$ by means of capacitor 72B. At this time, transistor 71A is turned off and transistor 71B is turned on, and therefore node 75 is charged to $(V74+V\phi-Vth)$ via transistor 71B.

Subsequently, the above operation is repeatedly effected and the potential is raised by $2(V\phi-Vth)$ in each basic circuit, thus supplying desired high voltage Vpp from the final stage.

However, in the actual voltage multiplier, a current flows in a load when it is driven by the stepped-up voltage. As a result, as shown by the timing chart of FIG. 5, the potential of node 73 is raised by clock signal $\phi 1$ and then lowered by $V_L$ by a current flowing via transistor 71A which is set in the conductive state. Likewise, the potential of node 74 is raised by clock signal $\phi 2$ and then lowered by $V_L$ by a current flowing via transistor 71B which is set in the conductive state. In this way, the potential stepped up in each basic circuit of the actual circuit is $2(V\phi-Vth-V_L)$.

As described above, in the conventional voltage multiplier, since the potential raised in each basic circuit is lowered by the threshold voltage of the transistor, the amplitude of the clock signal or power source voltage Vcc must be set to be not less than +3V. That is, the potential raised by means of each basic circuit is $2(V\phi-Vth-V_L)$. Since the back gate effect becomes larger in the latter stage basic circuit, threshold voltage Vth of the transistor in the latter stage basic circuit generally becomes larger. In a case where an intrinsic type (I-type) transistor having the initial threshold voltage of 0 V is used as transistor 71, the threshold voltage will be 1 V in the worst case. Assume that $V_L$ is 1 V and voltage Vpp of +20 V is derived by using 10 basic circuits. Then, it is necessary to set the lowest level of $V\phi$ or Vcc to +3 V. In this case, if the number of the basic circuits is excessively increased, the voltage step-up efficiency may be lowered by a leak current or the like and approx. 10 may be the upper limit thereof. The chip area will be significantly increased with an increase in the number of the basic circuits.

As described above, the conventional voltage multiplier has a narrow operation power source voltage margin and is particularly disadvantageous in the low operation voltage. Further, since the voltage step-up efficiency in each basic circuit is low, it becomes necessary to arrange a number of basic circuits in order to derive a desired output voltage and therefore the chip area will be increased when the whole circuit is integrated.

SUMMARY OF THE INVENTION

Accordingly, an object of this invention is to provide a voltage multiplier which can be used in a nonvolatile semiconductor memory and operated on a low operation voltage and whose occupied area can be reduced at the time of circuit integration.

According to one aspect of this invention, there is provided a voltage multiplier for use in a nonvolatile semiconductor memory comprising a plurality of basic circuits cascade-connected between a power source voltage terminal and an output terminal via a load circuit, each of the basic circuits comprising a first node to which an input voltage is applied; a first capacitor connected at one end to the first node; a second node connected to the other end of the first capacitor; a third node to which a first clock signal is supplied; a first level shifting circuit connected between the second and third nodes, for shifting the level of the first clock signal supplied to the third node and then outputting the first clock signal to the second node; a first transistor which is connected at one end to the first node and whose conduction state is controlled according to the potential of the first node; a fourth node to which the other end of the first transistor is connected; a second capacitor connected at one end to the fourth node; a fifth node to which the other end of the second capacitor is connected; a sixth node to which a second clock signal having pulse periods set at timings different from those of the first clock signal is supplied; a second level shifting circuit connected between the fifth and sixth nodes, for shifting the level of the second clock signal supplied to the sixth node and then outputting the second clock signal to the fifth node; a second transistor which is connected at one end to the fourth node and whose conduction state is controlled according to the potential of the fourth node; and a seventh node connected to the other end of the second transistor, for deriving out an output voltage.

BRIEF DESCRIPTION OF THE DRAWINGS

FIG. 6 is a circuit diagram showing the construction of a voltage multiplier according to one embodiment of this invention;

FIG. 7 is a circuit diagram showing the detail construction of a level shifting circuit used in the circuit of the above embodiment;

FIG. 10 is a circuit diagram showing the construction of the level shifting circuit of FIG. 7 in more detail;

FIG. 11 is a timing chart illustrating the operation of the circuit of the above embodiment;

FIG. 12 is a diagram showing voltage levels of various signals used in the circuit of the above embodiment;

FIG. 13 is a circuit diagram showing the detail construction of a level shifting circuit used in another embodiment of this invention;

FIG. 14 is a circuit diagram showing the detail construction of a level shifting circuit used in still another embodiment of this invention;

DETAILED DESCRIPTION OF THE PREFERRED EMBODIMENTS

Figure 1:
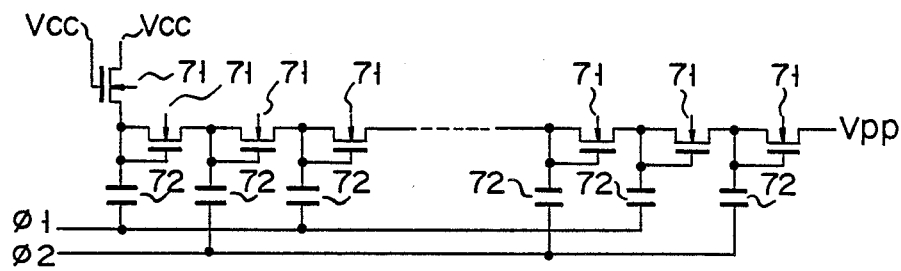
FIG. 1 is a circuit diagram of the conventional voltage multiplier.
Figure 2:
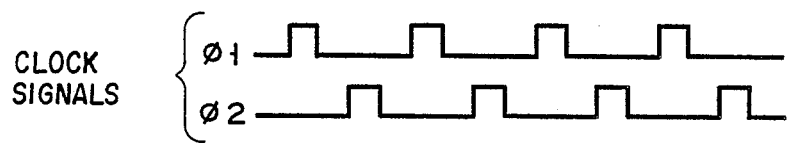
FIG. 2 is a timing chart of clock signals used in the conventional circuit of FIG. 1.
Figure 3:
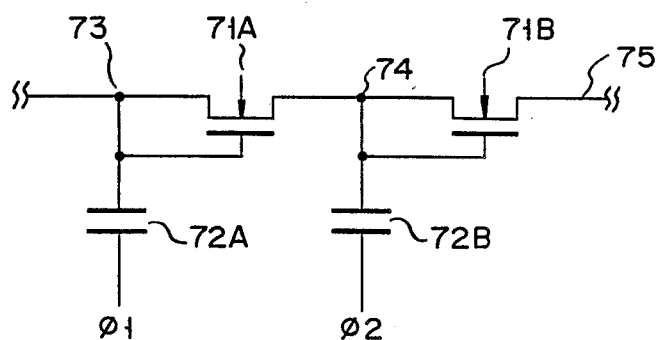
FIG. 3 is a circuit diagram showing the construction of a basic circuit of the conventional voltage multiplier of FIG. 1.
Figure 4:
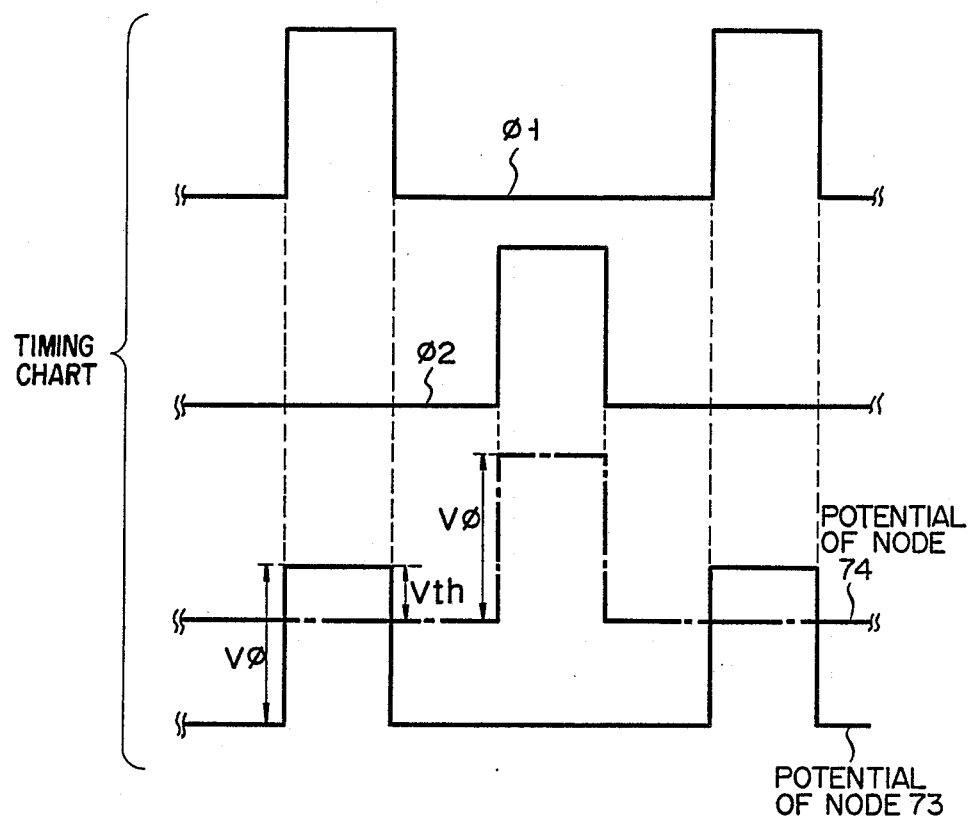
FIG. 4 is a timing chart of the basic circuit of FIG. 3.
Figure 5:
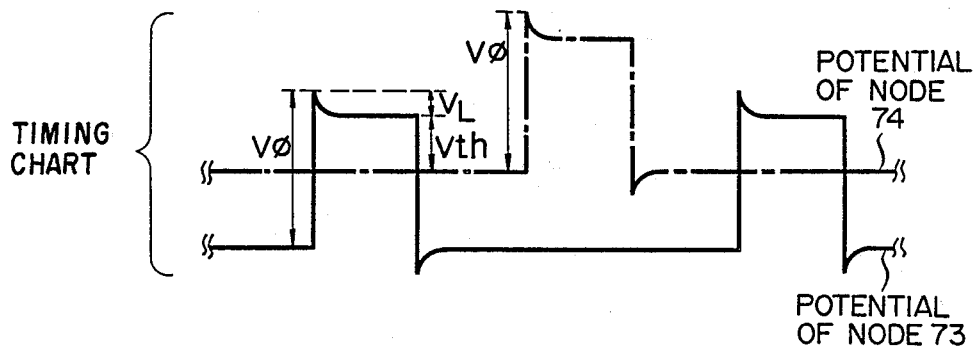
FIG. 5 is a timing chart of the basic circuit of FIG. 3.

As shown in FIG. 6, the source-drain path of N-channel MOS transistor 12 is connected between power source voltage terminal Vcc and node 11. The gate of transistor 12 is connected to power source voltage terminal Vcc and transistor 12 is always kept conductive. That is, transistor 12 acts as a load circuit. A plurality of basic circuits 20 are cascade-connected between node 11 and output terminal 13 from which high voltage Vpp is derived.

Each of basic circuits 20 includes two N-channel MOS transistors 21 and 22, two capacitors 23 and 24, and two level shifting circuits 25 and 26 having a signal inverting function.

In each of basic circuits 20, the source and gate of transistor 21 are commonly connected to node 27. Node 27 is connected to one end of capacitor 23. Node 28 to which the other end of capacitor 23 is connected is supplied with output clock signal $\phi 1'$ of level shifting circuit 25 for shifting the level of clock signal $\phi 1$ supplied to node 29. The drain of transistor 21 is connected to node 30. The source and gate of transistor 22 are commonly connected to node 30. Node 30 is connected to one end of capacitor 24. Node 31 to which the other end of capacitor 24 is connected is supplied with output clock signal $\phi 2'$ of level shifting circuit 26 for shifting the level of clock signal $\phi 2$ supplied to node 32. The drain of transistor 22 is connected to node 33 form which an output voltage is derived. Basic circuits 20 are cascade connected by connecting node 27 of each stage to node 11 or node 33 of the preceding stage.

FIG. 7 is a circuit diagram showing the detail construction of level shifting circuits 25 and 26. The level shifting circuits have the same construction. As shown in FIG. 7, node 41 to which power source voltage Vcc is applied is connected to one end of rectifier element 42 which is connected at the other end to node 43. The rectifier element 42 has a rectifier function of permitting a current to flow only in a direction from power source voltage Vcc side towards the other end thereof. Node 43 is connected to the source of P-channel MOS transistor 44 whose drain is connected to the drain of N-channel MOS transistor 45. The source of transistor 45 is connected to node 46 to which ground voltage Vss is applied. The gates of transistors 44 and 45 are connected to node 47 to which clock signal $\phi$ ($\phi 1$ or $\phi 2$ in the case of circuit 25 or 26, respectively) is supplied, and transistors 44 and 45 are combined to constitute CMOS inverter 48. An output signal of inverter 48 is supplied as clock signal $\phi'$ ($\phi 1'$ or $\phi 2'$). Further, node 47 is connected to the input terminal of inverter 49 whose output terminal is connected to one end of capacitor 50. The other end of capacitor 50 is connected to node 43.

Figure 8:
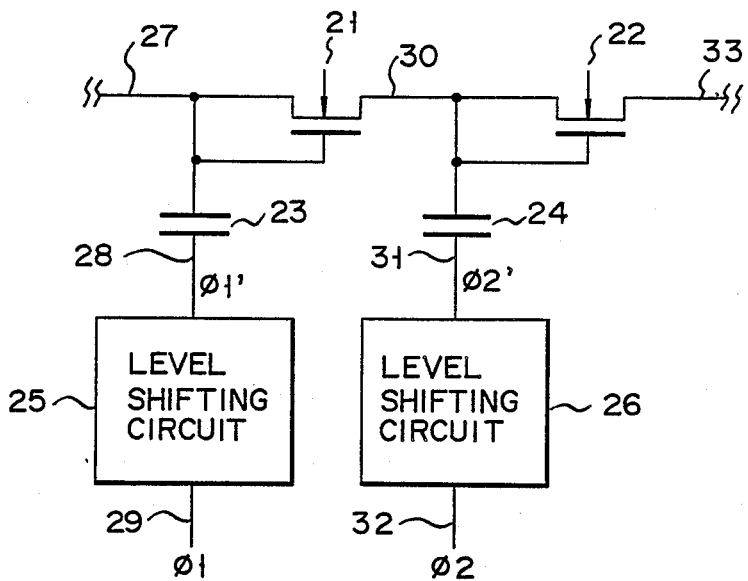
FIG. 8 is a circuit diagram of a basic circuit taken out from the circuit of the embodiment of FIG. 6.
Figure 9:
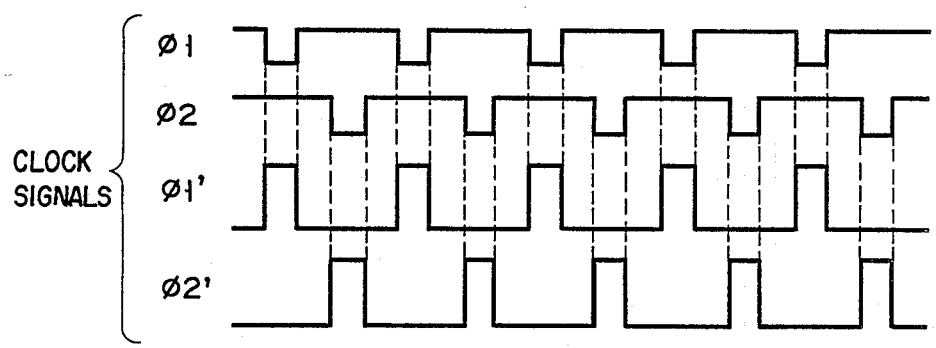
FIG. 9 is a timing chart of clock signals used in the circuit of the above embodiment.

FIG. 8 is a circuit diagram showing one stage of basic circuits 20 in the circuit of FIG. 6. FIG. 9 is a timing chart showing the relation between clock signals $\phi 1$ and $\phi 2$ supplied to respective level shifting circuits 25 and 26 and output clock signals $\phi 1'$ and $\phi 2'$. As shown in FIG. 9, the "L" level periods of clock signals $\phi 1$ and $\phi 2$ are set so as not to occur at the same time.

In this embodiment, rectifier element 42 of each of level shifter circuits 25 and 26 may be formed of N-channel MOS transistor 51 which is diode-connected and whose gate is connected to node 41 of power source voltage Vcc as shown in FIG. 10.

Now, the operation of the circuit with the above construction is explained.

FIG. 11 is a timing chart showing the relation between input clock signal $\phi$, output signal $\phi'$ and signal potential V43 of node 43 in the level shifting circuit of the construction shown in FIG. 10. FIG. 12 is a diagram showing the voltage values of signals $\phi$ and $\phi'$ and signal potential V43 in a case where power source voltage Vcc is set at +5 V. When input clock signal $\phi$ is at "H" level, the output signal of inverter 49 is set to the ground voltage or 0 V. At this time, that end of capacitor 50 which is connected to node 43 is charged to (Vcc−Vth) via transistor 51. Vth is a threshold voltage of the N-channel MOS transistor and is set at approx. 1 V when a back-gate bias voltage is applied thereto. As a result, potential V43 is set to approx. 4 V when input clock signal $\phi$ is at "H" level. In this case, P-channel MOS transistor 44 of inverter 48 is turned off and N-channel MOS transistor 45 is turned on. Therefore, 0 V is output as output clock signal $\phi'$.

Next, when input clock signal $\phi$ is set to "L" level (0 V), the output signal of inverter 49 is set to "H" level or Vcc level and the potential of node 43 is shifted by Vcc via capacitor 50. As a result, potential Vcc is raised to (2 Vcc−Vth). The potential level is approx. 9 V. At this time, the gate potential of transistor 51 becomes −(Vcc−Vth). The potential level is −4 V. and therefore transistor 51 is turned off. Since, in this case, input clock signal $\phi$ is at "L" level, P-channel POS transistor 44 of inverter 48 is turned on and N-channel MOS transistor 45 is turned off. As a result, level-shifted potential (2 Vcc−Vth) is supplied as output signal $\phi'$. In the same manner as described above, the potential of output clock signal $\phi'$ is shifted to a potential level higher than Vcc each time input clock signal $\phi$ is set to "L" level.

In this way, clock signals $\phi 1'$ and $\phi 2'$ whose amplitudes are raised to be larger than Vcc are output from level shifting circuits 25 and 26 of each basic circuit 20 shown in FIG. 6.

Further, when clock signal $\phi 1'$ is at "H" level and clock signal $\phi 2'$ is at "L" level in each of basic circuits 20 of FIG. 8, the potential of node 27 is raised by amplitude $V\phi$ of clock signal $\phi 1'$ through the capacitive derived by using 10 basic circuits. Then, it is coupling by capacitor 23 and set to (V27+$V\phi$). At this time, transistor 21 is turned on, permitting the above-described discharging current to flow from the capacitor to node 30 so that node 30 will be charged to (V27+$V\phi$−Vth−$V_L$).

When clock signal $\phi 1'$ is at "L" level and clock signal $\phi 2'$ is at "H" level, the potential of node 30 is raised by amplitude $V\phi$ of clock signal $\phi 2'$ through the capacitive coupling by capacitor 24 and set to (V30+$V\phi$). At this time, transistor 21 is turned off and transistor 22 is turned on, permitting the above-described discharging current to flow from the capacitor to node 33 so that node 33 will be charged to (V30+$V\phi$−Vth−$V_L$).

The same operation as described above is repeatedly effected so as to raise the potential by 2($V\phi$−Vth−$V_L$) in each of the basic circuits and thus high voltage Vpp is output from output terminal 13.

It should be noted that potential $V\phi$ is raised from Vcc level by means of level shifting circuit 25 or 26. Therefore, the stepped-up voltage in each of the basic circuits can be set sufficiently higher than that of the conventional case if the same power source voltage Vcc is used. If it is required to derive the same high voltage Vpp from the final stage, power source voltage Vcc can be lowered in the circuit of this embodiment. That is, the circuit of this invention can be operated on a lower power source voltage, thereby obtaining a larger operation power source voltage margin. Further, since the stepped-up voltage attained by means of each basic circuit can be set high, a desired high voltage can be obtained by means of less number of basic circuits, thus suppressing an increase in the occupied area at the time of integration.

FIG. 13 is a circuit diagram showing the construction of each of level shifting circuits 25 and 26 according to another embodiment of this invention. In this embodiment, diode 52 is used as rectifier element 42. Assuming that the forward bias voltage of diode 52 is $V_D$, then output clock signal $\phi'$ of the amplitude of (2Vcc−$V_D$) can be derived from the level shifting circuit. Since the value of $V_D$ is generally set at approx. 0.6 V although it may vary depending on the manufacturing process condition, the level shifting circuit can be more easily designed for the low voltage operation in comparison with the level shifting circuit of FIG. 10.

FIG. 14 is a circuit diagram showing the construction of each of level shifting circuits 25 and 26 according to still another embodiment of this invention. In this embodiment, the source-drain path of N-channel MOS transistor 53 is connected between node 43 and 41 to which power source voltage Vcc is applied. The gate of transistor 53 is connected to node 54. Further, the source-drain path of N-channel MOS transistor 55 is connected between node 41 and 54. The gate of transistor 55 is connected to node 54.

Node 43 is connected to the source of P-channel MOS transistor 44 whose drain is connected to the drain of N-channel MOS transistor 45. The source of MOS transistor 45 is connected to node 46 to which ground voltage Vss is applied. The gates of transistors 44 and 45 are commonly connected to node 47 to which clock signal $\phi$ ($\phi 1$ or $\phi 2$) is applied, and transistors 44 and 45 are combined to form CMOS inverter 48. Clock signal $\phi'$ ($\phi 1'$ or $\phi 2'$) is obtained as an output signal of inverter 48. Node 47 is connected to the input terminal of inverter 49 whose output terminal is connected to one end of capacitor 50. The other end of capacitor 50 is connected to node 43. Further, capacitor 56 is connected between nodes 47 and 54.

Figures 15, 16:
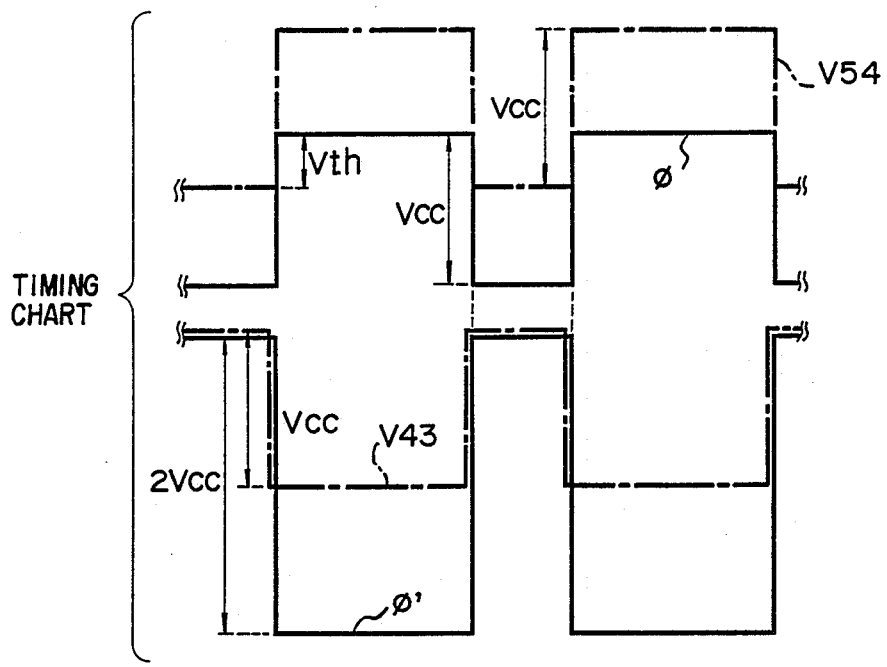
FIG. 15 is a timing chart illustrating the operation of the level shifting circuit of FIG. 14.
FIG. 16 is a diagram showing voltage levels of various signals used in the level shifting circuit of FIG. 14.

FIG. 15 is a timing chart showing the relation between input clock signal $\phi$, output clock signal $\phi'$, the potential V43 of node 43 and signal potential V54 in the level shifting circuit of the construction shown in FIG. 14. FIG. 16 is a diagram showing the values of signals $\phi$ and $\phi'$, and potentials V43 and V54 in a case where Vcc is set at +5 V. When input clock signal $\phi$ is at "L" level, capacitor 56 is charged to (Vcc−Vth) via transistor 55. At this time, threshold voltage Vth of transistor 55 is set at approx. 1 V because of the application of the back-gate bias voltage to the transistor. As a result, potential V54 of node 54 is set to approx. 4 V. In this case, transistor 53 is turned off.

Next, when clock signal $\phi$ is set to "H" level, potential V54 of node 54 is raised by the amplitude of signal $\phi$ via capacitor 56 and shifted to approx. 9 V. Since, at this time, transistor 53 is turned on, node 43 is charged to a potential level close to Vcc via transistor 53. Further, when input clock signal $\phi$ is at "H" level, P-channel MOS transistor 44 of inverter 48 is turned off and N-channel MOS transistor 45 is turned on. As a result, an output of 0 V is obtained as output clock signal $\phi'$.

After this, when input clock signal $\phi$ is set to "L" level again, the output signal of inverter 49 is set to "H" level or Vcc level, causing the potential of node 43 to be shifted by Vcc via capacitor 50. As a result, potential V43 is raised to 2 Vcc or approx. 10 V. At this time, P-channel MOS transistor 44 of inverter 48 is turned on and N-channel MOS transistor 45 is turned off. Therefore, a level-shifted voltage of 10 V is output as output clock signal $\phi'$. Then, each time input clock signal $\phi$ is set to "L" level, output clock signal $\phi'$ is level-shifted to a potential of approx. 2Vcc.

Therefore, the circuit of FIG. 6 using the level shifting circuit of the above construction can be operated on a lower power source voltage.

What is claimed is:

1. A voltage multiplier for use in nonvolatile semiconductor memory comprising:
    a plurality of basic circuits cascade-connected between a power source voltage terminal and an output terminal via a load circuit, each of said basic circuits comprising:
    a first node to which an input voltage is applied;
    a first capacitor connected at one end to said first node;
    a second node connected to the other end of said first capacitor;
    a third node to which a first clock signal is supplied;
    first level shifting means, connected between said second and third nodes and to which a power source voltage having the same amplitude as that of the first clock signal supplied to said third node is applied, for shifting the level of the first clock signal to a level higher than that of the power source voltage applied to said first level shifting means, and for outputting the first clock signal thus level-shifted to said second node;
    a first transistor which is connected at one end to said first node and whose conduction state is controlled according to the potential of said first node;
    a fourth node to which the other end of said first transistor is connected;
    a second capacitor connected at one end to said fourth node;
    a fifth node to which the other end of said second capacitor is connected;
    a sixth node to which a second clock signal, having level periods set at timings different from those of the first clock signal, is supplied;
    second level shifting means, connected between said fifth and sixth nodes and to which a power source voltage having the same amplitude as that of the second clock signal supplied to said sixth node is applied, for shifting the level of the second clock signal to a level higher than that of the power source voltage applied to said second level shifting means, and for outputting the second clock signal thus level-shifted to said fifth node;
    a second transistor which is connected at one to said fourth node and whose conduction state is controlled according to the potential of said fourth node; and
    a seventh node connected to the other end of said second transistor, for outputting an output voltage.

2. A voltage multiplier according to claim 1, wherein each of said first and second level shifting means comprises:
    an eighth node to which a power source voltage is applied;
    a ninth node to which a reference voltage is applied;
    a rectifier element connected at one end to said eighth node;
    a tenth node connected to the other end of said rectifier element;
    a first inverting circuit connected between said ninth and tenth nodes, for inverting a corresponding one of said first and second clock signals;
    a second inverting circuit for inverting a corresponding one of the first and second clock signals; and
    a third capacitor connected between the output terminal of said second inverting circuit and said tenth node.

3. A voltage multiplier according to claim 2, wherein said rectifier element is a diode-connected MOS transistor.

4. A voltage multiplier according to claim 2, wherein said rectifier element is a diode.

5. A voltage multiplier according to claim 1, wherein each of said first and second level shifting means comprises:
    an eighth node to which a power source voltage is applied;
    a ninth node to which a reference voltage is applied;
    a third transistor the source-drain path of which is connected at one end to said eighth node;
    a tenth node connected to the other end of the source-drain path of said third transistor;
    an eleventh node connected to the gate of said third transistor;
    a fourth transistor the source-drain path of which is connected between said eighth and eleventh nodes;
    a first inverting circuit connected between said ninth and tenth nodes, for inverting a corresponding one of said first and second clock signals;
    a second inverting circuit for inverting a corresponding one of the firstand second clock signals;
    a third capacitor connected between the output terminal of said second inverting circuit and said tenth node; and
    a fourth capacitor connected between said eleventh node and an input node to which a corresponding one of the first and second clock signals is supplied.

6. A voltage multiplier according to claim 5, wherein the gate of said fourth transistor is connected to said eighth node.

* * * * *